(12) United States Patent  (10) Patent No.: US 7,725,276 B2
Kimishima  (45) Date of Patent: May 25, 2010

(54) SIGNAL WAVEFORM ANALYZING DEVICE

(75) Inventor: Tatsuya Kimishima, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 223 days.

(21) Appl. No.: 11/806,646

(22) Filed: Jun. 1, 2007

(65) Prior Publication Data

US 2008/0162096 A1    Jul. 3, 2008

(30) Foreign Application Priority Data

Dec. 28, 2006    (JP) .............................. 2006-356326

(51) Int. Cl.
  *G01R 13/00*    (2006.01)
  *G06F 19/00*    (2006.01)
(52) U.S. Cl. .......................................... 702/66; 702/70
(58) Field of Classification Search .................. 702/66, 702/69, 70, 82, 190; 703/6
See application file for complete search history.

(56) References Cited

U.S. PATENT DOCUMENTS 4,559,602 A  *  12/1985  Bates, Jr. ...................... 702/71
4,755,889 A  *   7/1988  Schwartz ...................... 360/32
5,092,343 A  *   3/1992  Spitzer et al. ............... 600/515
2006/0132116 A1*  6/2006  Hamre et al. ............. 324/76.19

FOREIGN PATENT DOCUMENTS

JP    5-266121 A  * 10/1993
JP    6-058968 A  *  3/1994
JP    9-016652 A  *  1/1997

* cited by examiner

*Primary Examiner*—Bryan Bui
(74) *Attorney, Agent, or Firm*—Buchanan Ingersoll & Rooney PC

(57) ABSTRACT

A signal waveform analyzing device includes an extracting unit that extracts, from waveform information indicating temporal variation in signal level of a component of an electronic circuit, a signal level that satisfies a condition for a phenomenon to be observed, and outputs extracted signal level as an extraction result.

11 Claims, 3 Drawing Sheets

FIG.2

305 clk : top.clock_in ;
sig_a : top.mod.a ;
sig_b : top.mod.b ;
sig_q : top.mod.q ;

FIG.3

306 always @(posedge clk) begin
if (a == 1) begin
 exout("c1", sig_a);
end
end

307 print    "signal sig_a extract by c1";
count   "c1 as 0   :"c1 as 0;
count   "c1 as 1   :"c1 as 1;
count   "c1 all    :"c1 all;

FIG.6

311 signal sig_a extract by c1
c1 as 0    : 2
c1 as 1    : 3
c1 all     : 5

FIG.7

308 check e_c1_0 "c1 as 0 : $1" 1 to 10;
check e_c1_1 "c1 as 1 : $1" 3 to 5;
check e_c1_a "c1 all   : $1" 100 to 200;

FAIL!
3 expections judged
2 expections passed
---
e_c1_a : 5 (100 to 200)

SIGNAL WAVEFORM ANALYZING DEVICE

BACKGROUND OF THE INVENTION

1. Field of the Invention

The present invention relates to a technology for analyzing signal levels of components of an electronic circuit.

2. Description of the Related Art

FIG. 9 is a schematic for explaining an example of a conventional method of verifying a design of an electronic circuit. The verification method is one of simple methods in which a simulation model 103 is created of a circuit that is to be verified. The simulation model 103 alone is incapable of verification, and therefore, a test bench 104 is created to input a test pattern 102 thereto. Then, the simulation model 103 is incorporated into the test bench 104. The test pattern 102 is added to the simulation model 103, and simulation is performed. A plurality of simulators that performs the simulation has a function of recording the signal level of wiring in the simulation model during the simulation, which enables to acquire waveform information 101 at the time of the simulation. The waveform information 101 records signal-level values at respective time points of the simulation. Although the waveform information 101 is acquired through the simulation in the above description, it is possible to acquire the waveform information 101 from actual equipment by using an analyzer such as a logic analyzer. A designer debugs by displaying as signal waveform the waveform information 101 acquired during the simulation or through the analyzer on a display device.

FIG. 10 is a schematic for explaining another example of a conventional method of verifying a design of an electronic circuit. The verification method is more efficient than the verification method illustrated in FIG. 9. As shown in FIG. 10, a result-dump unit 203 is incorporated in a test bench 204. When simulation is performed after a test pattern 202 is added to the test bench 204, the result-dump unit 203 extracts necessary information from information acquired during the simulation and outputs a dump result 205. A result-dump step 201 is incorporated in the test pattern 202 as required so that the result-dump unit 203 can function. The dump result 205 and a predetermined expected value 206 are compared in a comparing unit 207 to check whether the simulation model 103 operates as expected. This eliminates the need to display a signal to be observed as waveform and check the waveform visually, and enables more efficient verification. The simulation model 103, which is the object of verification, is the same as that shown in FIG. 9.

Japanese Patent Application Laid-Open No. H6-58968 discloses a method in which an expected value is prepared for waveform information, so that acquired waveform information is compared with the expected value according to comparison rules. The display method is changed depending on whether the waveform information and the expected value match. Thus, a difference in waveforms can be easily recognized.

Japanese Patent Application Laid-Open No. H5-266121 discloses a method in which waveform information and the expected value of the waveform information are compared and only dissimilar parts are displayed. Accordingly, it can be checked whether the waveform information and the expected value match in a short period of time.

Japanese Patent Application Laid-Open No. H9-16652 discloses a method in which an expected value of a simulation result is generated by a computer program for use in comparison.

However, according to the conventional method shown in FIG. 9, the acquired waveform information is checked visually, which affects work efficiency, and may cause human error of overlooking a mistake.

According to the conventional method shown in FIG. 10, the result-dump unit needs to be incorporated in the test bench, and sometime, the result-dump step needs to be incorporated in the test pattern. If the information to be checked is found at a later stage, simulation is performed again after addition of the result-dump unit and the result-dump step. Generally, simulation requires considerable amount of time, and if the simulation is performed again, development schedule is extended.

According to the conventional methods disclosed in Japanese Patent Application Laid-Open Nos. H6-58968 and H5-266121, the expected value is necessary for the entire simulation time of a signal that is to be verified. Consequently, considerable time is required to prepare the expected value. Further, there is a time period in which the waveform information has no effect on demand function, and naturally, there is no need to verify operation during the time period. It is difficult to identify the time period to create the expected value. According to the conventional method disclosed in Japanese Patent Application Laid-Open No. H9-16652, the expected value is created by a computer program. However, as in the above conventional methods, it is problematic to create the expected value during the time period.

SUMMARY OF THE INVENTION

It is an object of the present invention to at least partially solve the problems in the conventional technology.

According to an aspect of the present invention, a signal waveform analyzing device includes an extracting unit that extracts, from waveform information indicating temporal variation in signal level of a component of an electronic circuit, a signal level that satisfies an extracting condition for a phenomenon to be observed, and outputs extracted signal level as an extraction result.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 2 is an example of signal information;

FIG. 3 is an example of extracting conditions;

FIG. 4 is an extraction result extracted from waveform information by an extracting unit shown in FIG. 1 based on the signal information and the extracting conditions;

FIG. 5 is an example of compiling method information;

FIG. 6 is an example of a compiling result;

FIG. 7 is an example of an expected compiling value;

DETAILED DESCRIPTION OF THE PREFERRED EMBODIMENTS

Exemplary embodiments of the present invention are explained in detail below with reference to the accompanying drawings.

Figure 1:
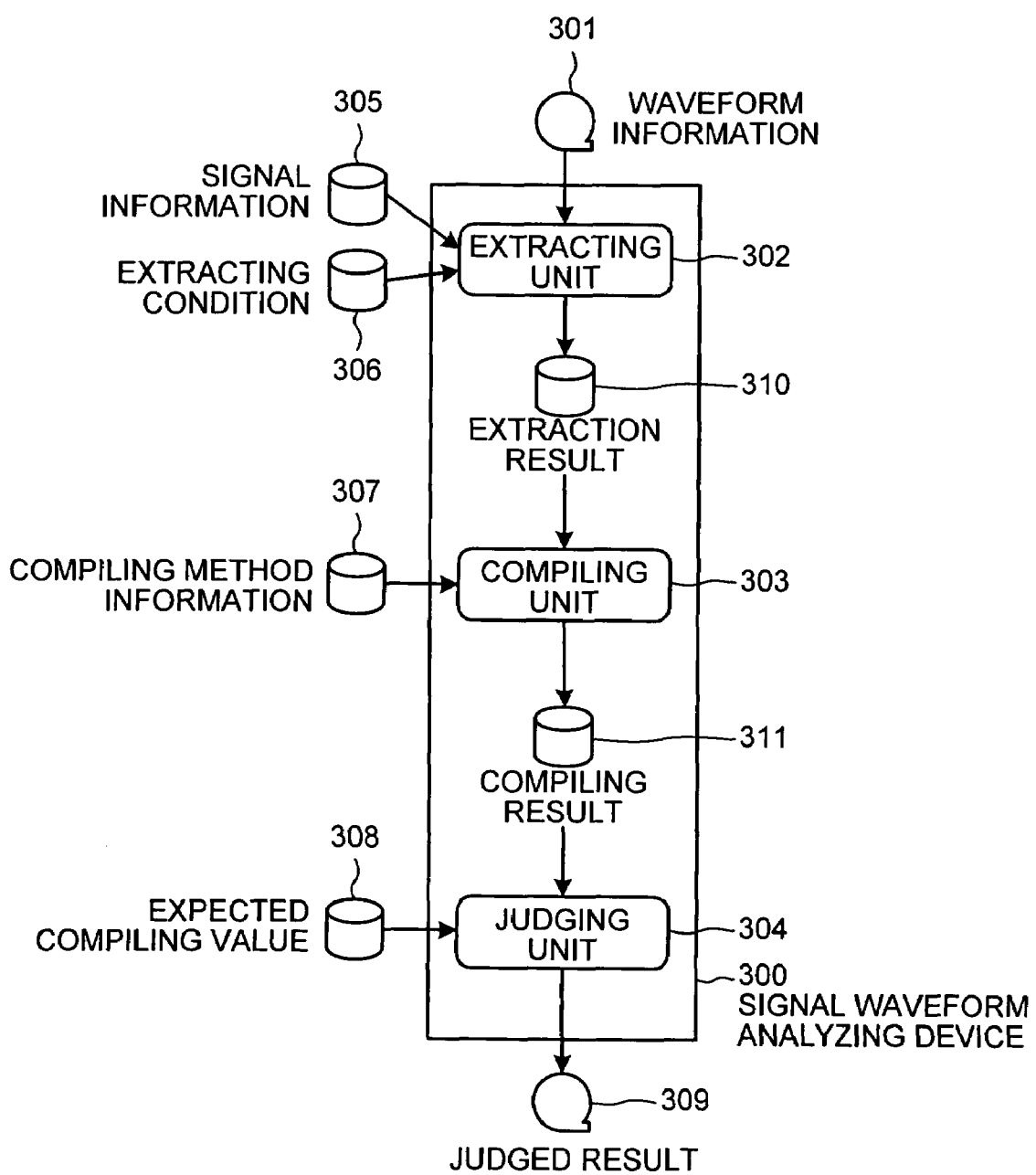
FIG. 1 is a functional block diagram of a signal waveform analyzing device according to an embodiment of the present invention.

FIG. 1 is a functional block diagram of a signal waveform analyzing device 300 according to an embodiment of the present invention shown along flow of data. The signal waveform analyzing device 300 includes an extracting unit 302, a compiling unit 303, and a judging unit 304.

The extracting unit 302 analyzes waveform information 301 according to signal information 305 and an extracting condition 306, and outputs an extraction result 310. The compiling unit 303 compiles the extraction result 310 according to compiling method information 307, and outputs a compiling result 311. The judging unit 304 judges whether the compiling result 311 is within a predetermined range of an expected compiling value 308, and outputs a judged result 309.

The waveform information 301 is recorded information on time variation in signal levels of components of an electronic circuit such as wiring and elements. The signal information 305 defines a correspondence between a signal specified by the extracting condition 306 and a signal recorded in the waveform information 301. The extracting condition 306 describes components of a signal, i.e., elements of a condition, and conditions to be satisfied in Boolean expression and by an event such as the rise and fall of the signal. The extracting unit 302 searches the waveform information 301 from the first time point for the time when the conditions described in the extracting condition 306 are satisfied. If there is the time when the conditions are satisfied, the extracting unit 302 checks the signal level of the signal based on record signal information described in the extracting condition 306, and records the time, the type of the satisfied extracting condition 306, and the signal level of the signal in the extraction result 310. A plurality of extracting conditions can be described in the extracting condition 306. In this case, the respective extracting conditions are checked in parallel simultaneously, and a satisfied condition is recorded in the extraction result 310.

The extraction result 310 can also be retrieved from the signal waveform analyzing device 300 and checked at this point. By selecting and displaying only a required extraction condition from the extracting conditions described in the extracting condition 306, the extraction result 310 can be checked easier.

Subsequently, the compiling unit 303 compiles the extraction result 310 according to the compiling method information 307. The compiling method information 307 includes information such as the number of times the extracting conditions specified by the extracting condition 306 have been satisfied, a value of the record signal recorded when the extracting conditions are satisfied, frequency distribution of the value, frequency distribution of a value group, and a list of time and values. The compiling unit 303 outputs the compiling result 311 according to the above specifications.

Consequently, the judging unit 304 checks the compiling result 311 according to the range of the expected value of the compiling result described as the expected compiling value 308, and outputs the judged result 309. The expected compiling value 308 includes the type and range of the compiling result. The judging unit 304 judges whether the compiling result is within the range of a corresponding type of the compiling result, and outputs a judged result. The expected compiling value 308 can include a plurality of types of the compiling results. In this case, judgment is made for each of the type as to whether the compiling result is within the range of the expected value described as the expected compiling value 308.

As described above, according to the embodiment, based on the signal information 305 indicating a target signal among those to be output from a target electronic circuit and the extracting condition 306 describing characteristics and conditions of waveform to extract a phenomenon that is to be observed, the signal waveform analyzing device 300 sequentially analyzes the waveform information 301 on temporal variation in the signal level of wiring of the electronic circuit from earlier time. The signal waveform analyzing device 300 sequentially outputs, as the extraction result 310, the time at which the extracting condition 306 is satisfied, the type of the extracting condition, and the signal level of the target signal. Then, based on the compiling method information 307, the recorded observation time, the type of the extracting condition and the signal level of the signal are compiled as the extraction result 310. Further, it is judged whether the compiling result 311 is within a predetermined expected range.

With the signal waveform analyzing device 300 according to the embodiment, it is possible to perform required check without checking the waveform information 301 visually, which improves the operating efficiency to a great extent. Further, the signal waveform analyzing device 300 automatically performs the process of verification, and it is possible to avoid any human error during the checking process. Moreover, there is no need to incorporate a result-dump unit into a test bench, differently from the conventional methods. Furthermore, because the verification is performed on the waveform information 301, there is no need to repeat simulation even when check items increase. There is no need to prepare the expected value for the waveform information 301, and therefore, there is no need to consider the time period in which the expected value does not affect demand function.

The extracting unit 302, the compiling unit 303, and the judging unit 304 can be used as models for simulation, and the waveform information 301 can be input as a signal pattern for simulation models. In the embodiment described above, the signal waveform analyzing device 300 is implemented as software by executing a computer program on a computer. However, the signal waveform analyzing device 300 can also be implemented in hardware (electronic circuit). In this case, it is possible to curtail development of new software by establishing an electronic circuit as a simulation model in an existing logic simulation environment. The simulation model can include the signal information 305, the extracting condition 306, and the extraction result 310.

The signal level in the waveform information 301 when the extracting condition is satisfied can be stored as a variable, and the variable can be used as a condition in other extracting conditions.

FIG. 2 is an example of the signal information 305. The signal information 305 in the example is described in a text file, and each line corresponds to one signal. The line ends with a semicolon. In the first line, "c1$k$" denotes a signal clock_in in the top module of the signal that is recorded in the waveform information. A dot "." denotes a separation of module layers. In a second line, "sig_a" denotes a signal a in a module mod in the top module of the signal that is recorded in the waveform information. When module layers increase, modules can be combined by the dot. In the same manner, each line corresponds to a signal.

FIG. 3 is an example of the extracting condition 306. The extracting condition 306 in the example is written like Verilog. If the signal a is "1" at the time of rising edge of the signal c1$k$, the type of extraction condition c1 is recorded as a value of the signal sig_a. The signals are combined with a signal of the waveform information according to the signal information shown in FIG. 4. Calculation and a variable of the condition are not used in the example. However, the signal value and the extraction condition can be obtained by logical operation or arithmetic operation. If a variable is defined in the extraction condition, a signal and a constant value are calculated when the extraction condition is satisfied, and the variable is substituted by a value to be stored. The stored value is maintained until substituted by a new value.

In the example, the value of the record signal that at the time the extraction condition is satisfied is recorded. However, if an expression is defined in the extraction condition to obtain the time of reading the record signal, it is possible to find and record a different time value than the time when the extraction condition is satisfied. The time can be of a later time than the time at which the extraction condition is satisfied.

FIG. 4 is an example of the extraction result 310 obtained by the extracting unit 302 from the waveform information 301 based on the signal information 305 and the extracting condition 306. The extraction result 310 is in a format such as Value Change Dump (VCD) format. The extracting unit 302 checks a signal from the initial time of the waveform information, and records the time when the extraction condition is satisfied, the type of the extraction condition, and the value of the record signal. In the example of FIG. 4, the first line indicates that the extraction condition c1 is satisfied and the value of the record signal is "1" at the time of 100. The same is applied to the following lines.

FIG. 5 is an example of the compiling method information 307. The first line indicates an instruction "print", and a character string enclosed with double quotation marks is output as the compiling result. The second line indicates an instruction "count" to output the number of times the value of the record signal is "0" after the extraction condition c1 is satisfied. A character string enclosed with double quotation marks after a keyword "count" is output as it is. The third line indicates an instruction "count" to output the number of times the value of the record signal is "1". The fourth line indicates an instruction "count" to output the number of times the signal is output regardless of the value of the record signal.

FIG. 6 is an example of the compiling result 311. The compiling result 311 of FIG. 6 is obtained through the compiling unit 303 by collecting the extraction result 310 of FIG. 4 based on the compiling method information 307 shown in FIG. 5. The first line indicates the character string enclosed with double quotation marks in the first line of the compiling method information 307 that is output as it is. The second line indicates compilation of the number of times the value of the record signal is "0" after the extraction condition c1 is satisfied. Similarly, other results compiled according to the compiling method information 307 are shown in the example. In the example, the value of the record signal indicates a unique value. However, a range or a list of values can be specified for the record signal.

FIG. 7 is an example of the expected compiling value 308. The first line indicates a judging condition "e_c1_0" to find the character string "c1 as 0: $1" from the compiling result 311. When the character string is found, it is judged whether $1 is within the range of 1 to 10. Incidentally, $1 is an arbitrary value and indicates the location of the compiling result. Similar examples are shown in the following lines.

Figure 8:
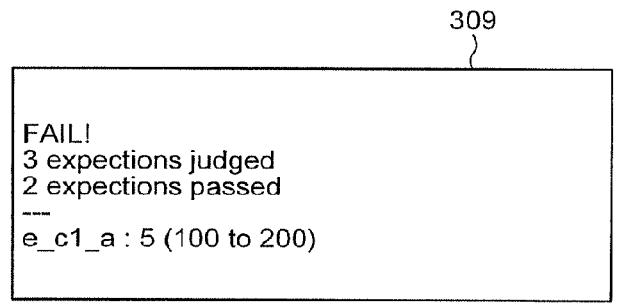
FIG. 8 is an example of a judged result.
Figure 9:
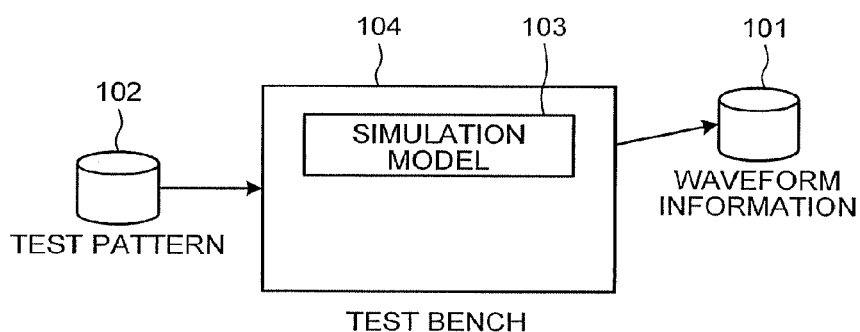
FIGS. 9 and 10 are schematics for explaining examples of conventional methods of verifying a design of an electronic circuit.
Figure 10:
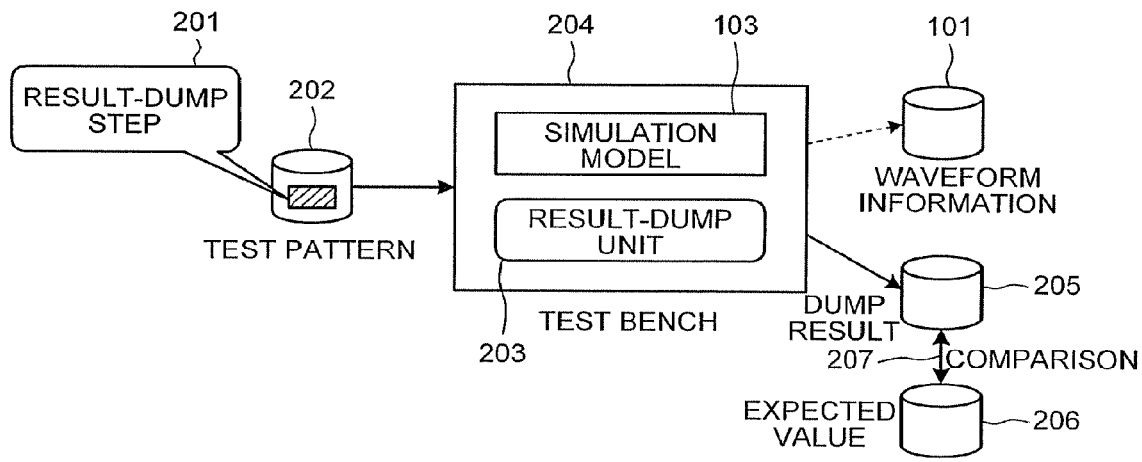

FIG. 8 is an example of the judged result 309. The judged result 309 of FIG. 8 is obtained through the judging unit 304 by judging the compiling result 311 of FIG. 6 based on the expected compiling value 308 shown in FIG. 7. The first line indicates an output of "FAIL!" resulting from that none of judging conditions in the expected compiling value 308 is satisfied. The second line indicates an output of the number of judging conditions in the input expected compiling value 308. The third line indicates an output of the number of judging conditions that are satisfied. From the fifth line onwards is a list of judging conditions that are not satisfied. The list contains the name of the judging condition, the compiling result, and contents of the judging condition.

As described above, in the signal waveform analyzing device according to the embodiment of the present invention, the extracting unit outputs, as the extraction result, a signal level extracted from the waveform information at the time the extracting condition is satisfied. The judging unit judges whether the extraction result is within a predetermined range. This improves work efficiency limited by the ability of human visual observation in the conventional technologies, reduces human error, and also eliminates the need to prepare a result-dump unit and a result-dump step.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A signal waveform analyzing device comprising:
an extracting unit configured to extract, from recorded and received waveform information indicating a temporal variation in signal levels of a plurality of signals of a component of an electronic circuit, a first signal level at a point in time when an extracting condition, which specifies a phenomenon to be observed and indicates if a signal level of a selected at least one of the signals in the waveform information satisfies a selected value, is satisfied, and to output the first signal level as an extraction result.

2. The signal waveform analyzing device according to claim 1, wherein the extracting unit outputs observation content in waveform information specified, from among the received waveform information, based on signal information that indicates a target signal when the extracting condition is satisfied.

3. The signal waveform analyzing device according to claim 1, further comprising a compiling unit that compiles the extraction result according to a predetermined compiling condition to obtain a compiling result.

4. The signal waveform analyzing device according to claim 1, further comprising a judging unit that judges whether the extraction result is within a predetermined range.

5. The signal waveform analyzing device according to claim 3, further comprising a judging unit that judges whether the compiling result is within a predetermined range.

6. The signal waveform analyzing device according to claim 3, wherein the compiling unit compiles an observation time, extracting conditions, and signal levels indicated by the received waveform information to obtain the compiling result.

7. The signal waveform analyzing device according to claim 5, wherein
the judging unit compares an expected compiling value with the compiling result, and
the judging unit judges whether the compiling result is within a range of the expected compiling value.

8. The signal waveform analyzing device according to claim 5, wherein
at least one of the extracting unit, the compiling unit, and the judging unit is modeled into a simulation model, and
the waveform information is input as an input-signal pattern for simulation to the simulation model.

9. The signal waveform analyzing device according to claim 1, wherein the first signal level is stored as a variable, and the variable is used for another extracting condition.

10. The signal waveform analyzing device according to claim 1, wherein the extracting unit outputs, as the extraction result, the first signal level and a second signal level at a point in time after elapse of a predetermined period of time from when the extracting condition is satisfied.

11. A signal waveform analyzing device comprising an extracting unit configured to extract, from recorded and received waveform information indicating a temporal variation in signal levels of a plurality of signals of a component of an electronic circuit, a first signal level at a point in time after elapse of a predetermined period of time from when an extracting condition, which specifies a phenomenon to be observed and indicates if a signal level of a selected at least one of the signals in the waveform information satisfies a selected value, is satisfied, and to output the first signal level as an extraction result.

* * * * *